United States Patent [19]

Weeks et al.

[11] Patent Number: 5,692,873

[45] Date of Patent: Dec. 2, 1997

[54] APPARATUS FOR HOLDING A PIECE OF SEMICONDUCTOR

[75] Inventors: Anthony R. Weeks, Gilbert; Todd R. Beasley, Tempe; Craig D. Gordy, Scottsdale, all of Ariz.

[73] Assignee: Motorola, Inc., Schaumburg, Ill.

[21] Appl. No.: 707,369

[22] Filed: Sep. 4, 1996

Related U.S. Application Data

[63] Continuation of Ser. No. 414,601, Mar. 31, 1995, abandoned.

[51] Int. Cl.$^6$ .................................................. B65G 47/24
[52] U.S. Cl. .................. 414/627; 204/298.15; 269/21; 414/936; 414/941
[58] Field of Search .................. 414/783, 935, 414/936, 941, 940, 939, 627; 29/25.01; 269/21; 204/298.15; 148/DIG. 162

[56] References Cited

U.S. PATENT DOCUMENTS

| 3,645,581 | 2/1972 | Lasch, Jr. et al. | 414/627 |
| 4,523,985 | 6/1985 | Dimock | 414/939 |
| 4,559,716 | 12/1985 | Tadokoro | 414/935 |
| 4,747,608 | 5/1988 | Sato et al. | 379/1 E |
| 4,869,481 | 9/1989 | Yabu et al. | 269/21 |
| 4,955,590 | 9/1990 | Narushima et al. | 269/21 |
| 5,065,092 | 11/1991 | Sigler | 324/158 F |
| 5,065,495 | 11/1991 | Narushima et al. | 29/559 |
| 5,316,276 | 5/1994 | Heinle | 269/21 |

FOREIGN PATENT DOCUMENTS

| 56-89744 | 7/1981 | Japan | 269/21 |
| 140546 | 6/1988 | Japan | 378/208 |
| 1-214042 | 8/1989 | Japan | 269/21 |
| 4-124853 | 4/1992 | Japan | 414/941 |
| 5-190414 | 7/1993 | Japan | 414/935 |

OTHER PUBLICATIONS

Webster's Inetrnational Dictionary, Third Ed. (1959) p. 1113.

*Primary Examiner*—Janice L. Krizek
*Attorney, Agent, or Firm*—Joe E. Barbee; George C. Chen

[57] ABSTRACT

An apparatus for and method of holding a semiconductor wafer (11) during a manufacturing process supports the semiconductor wafer (11) in a substantially planar form (15) with a two-platform wafer chuck (19). The two-platform wafer chuck (19) is compatible with handling warped and unwarped wafers, wafer transferring and handling techniques which maintain wafer flatness, and semiconductor manufacturing processes such as photolithography and autoprobing which require semiconductor wafers to be held in a flat configuration.

20 Claims, 1 Drawing Sheet

APPARATUS FOR HOLDING A PIECE OF SEMICONDUCTOR

This application is a continuation of prior application Ser. No. 08/414,601, filed Mar. 31, 1992, now abandoned.

BACKGROUND OF THE INVENTION

This invention relates, in general, to semiconductor manufacturing, and more particularly, to a method and apparatus for holding a piece of semiconductor during a semiconductor manufacturing process.

Since cleanroom space within a semiconductor manufacturing facility is expensive to maintain, automated semiconductor wafer handling equipment is designed with tight spatial tolerances for space conservation. However, as a result of various processing steps including repeated high temperature annealing, wafer thinning, and compressive and tensile film deposition, semiconductor wafers warp and exceed the tight spatial tolerances of the automated wafer handling equipment. Impacting neighboring objects, the warped semiconductor wafers easily chip, fracture, or break.

The consequence of warped wafer breakage is most severe during non-manual electrical device verification or auto-probe where wafer warpage can exceed 900 microns. The wafer is more likely to be warped when it reaches the auto-probe step since it has already completed a majority of its semiconductor processing steps. Due to the amount of work already performed on the wafer prior to the auto-probing step, breakage during auto-probing is an extremely costly manufacturing yield loss.

Warped wafers which are not held flat will easily fracture during handling by conventional wafer handling equipment such as air tracks that use columns of forced air to support and transfer wafers from one location to another. When the transported wafers are warped, the air columns do not provide proper support, and consequently, the warped wafers slide off the columns of forced air and fracture upon impacting a nearby object.

Warped wafers will often not be held flat by conventional wafer chucks including those having elevated receiving pins. Warped wafers that are not held flat and do not fracture during handling will not be processed correctly in an automated semiconductor manufacturing environment. For instance, if the warped wafers are not flattened during photolithography processing, the resulting photoresist on the warped wafer will be misshapened. Additionally, warped wafers will not make proper electrical contact with probe needles during an auto-probe test, and consequently data taken from the devices or circuits on the warped wafer will not be representative of the actual device or circuit performance.

When warped wafers are not held flat on a wafer chuck during auto-probe, human intervention is required to ensure the wafer is flat during probing. The auto-prober is used in a manual mode where the human operator must physically flatten each warped wafer on the wafer chuck prior to probing the devices on the warped wafer. This tedious task dramatically increases the probe process cycle time.

Accordingly, a need exists for holding semiconductor wafers during a semiconductor manufacturing process which supports semiconductor wafers in a substantially planar form, conserves cleanroom space for economic feasibility, is compatible with holding warped and unwarped pieces of semiconductor, is compatible with processing steps such as photolithography and auto-probing, and is also compatible with wafer handling techniques which maintain wafer flatness.

DETAILED DESCRIPTION OF THE DRAWINGS

Figure 1:
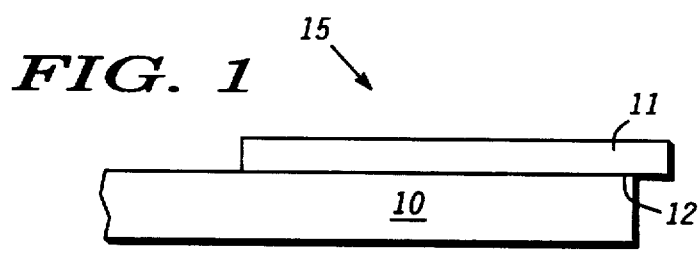
FIG. 1 is an embodiment of the present invention illustrating a side view of a wafer handling device supporting a semiconductor wafer.

A side view of wafer handling device 10 supporting semiconductor wafer 11 is illustrated in FIG. 1. Wafer handling device 10 has substantially planar surface 12 which uses an attraction device for flattening semiconductor wafer 11 into substantially planar form 15 against substantially planar surface 12. Substantially planar surface or flat surface 12 has a plurality of holes in which the attraction device resides. Wafer handling device 10 will hold semiconductor wafer 11 in substantially planar form 15 regardless of whether semiconductor wafer 11 was originally warped or unwarped and regardless of whether semiconductor wafer 11 is held in a horizontal, vertical, upside-down, or other position.

Semiconductor wafer 11 is any piece of semiconductor including small substrate pieces and large diameter wafers. Semiconductor wafer or piece of semiconductor 11 can be flat or warped. Composition of piece of semiconductor 11 comprises any semiconducting material such as silicon, gallium arsenide, indium phosphide, or the like.

Figure 2:
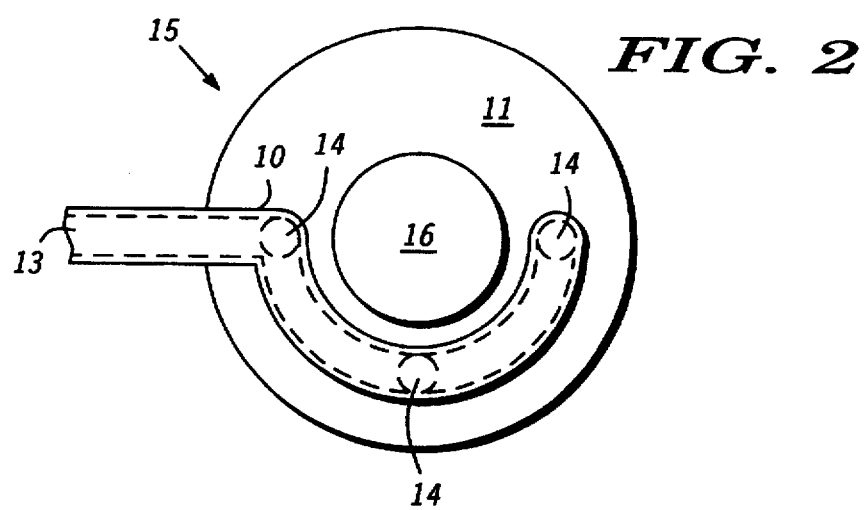
FIG. 2 is an embodiment of the present invention illustrating a bottom-up view of the wafer handling device transferring the semiconductor wafer to a wafer chuck.

FIG. 2 depicts a bottom-up view of the transferal of semiconductor wafer 11 from wafer handling device 10 to wafer chuck 16. In the preferred embodiment, wafer handling device 10 and wafer chuck 16 support semiconductor wafer 11 on a back surface of semiconductor wafer 11. Alternatively, wafer handling device 10 and wafer chuck 16 can provide support on different sides of semiconductor wafer 11.

Contained within handling device 10, attraction device 13 uses a vacuum force to hold the piece of semiconductor 11 in substantially planar form 15. The vacuum force emanates from a plurality of holes 14 which, as mentioned with respect to FIG. 1, is on flat surface 12 of handling device 10. Attraction device 13 can also use a mechanical, magnetic, pneumatic, or electrostatic force. It is to be understood that the embodiment of attraction device 13 may differ from the preferred embodiment illustrated in FIG. 1. The desired force used by attraction device 13 will determine the appropriate embodiment of attraction device 13. For instance, flat surface 12 can have a single hole in which attraction device or vacuum device 13 resides and grooves connected to the single hole for distributing a vacuum force across flat surface 12. Alternatively, a circular clamp can be used around the perimeter of semiconductor wafer 11 to provide a mechanical force for supporting semiconductor wafer 11 in substantially planar form 15. The purpose of attraction device 13 is to force semiconductor wafer 11 down on flat surface 12 and to hold semiconductor wafer 11 in a flat or unwarped configuration.

Wafer chuck or holding device 16 is circular in shape, and wafer handling device or handling device 10 is crescent-like in shape with a support arm attached to one end of the crescent. While holding device 16 and handling device 10 are interlocked as illustrated in FIG. 2, semiconductor wafer 11 is transferred from handling device 10 to holding device 16. The transferal maintains substantially planar form 15 of semiconductor wafer 11 in the following manner: handling device 10 initially supports semiconductor wafer 11 in substantially planar form 15; handling device 10 moves toward holding device 16; handling device 10 lowers semiconductor wafer 11 onto holding device 16; holding device 16 holds semiconductor wafer 11 while maintaining substantially planar form 15 of semiconductor wafer 11; handling device 10 releases semiconductor wafer 11; handling device 10 lowers and moves away from semiconductor wafer 11 and holding device 16; and then holding device 16 supports semiconductor wafer 11 in substantially planar form 15. Holding device 16 remains stationary during the previously described transferal procedure. However, the transferal can also be completed while handling device 10 remains stationary. In this manner, holding device 16 moves toward handling device 10 and raises upward to contact and support semiconductor wafer 11 in substantially planar form 15. Then handling device 10 releases semiconductor wafer 11, and holding device 16 moves upward removing semiconductor wafer 11 away from handling device 10. Yet another transferal procedure incorporates the movements of both handling device 10 and holding device 16 to accomplish the transferal.

After transferal of semiconductor wafer 11 from handling device 10 to holding device 16, a portion of semiconductor wafer 11 may return to its originally warped configuration. Since holding device 16 supports semiconductor wafer 11 at a central portion and not around an edge portion, the edge portion of semiconductor wafer 11 which is not supported by holding device 16 may return to its originally warped form. However, the central portion of semiconductor wafer 11 which is supported by holding device 16 is held in substantially planar form 15. The warping, if any, resulting from the small surface area of holding device 16 is not considered sufficient to be detrimental to successful processing of wafer 11.

It is to be understood that the shapes of holding device 16 and handling device 10 may vary from the embodiments illustrated in FIG. 2. The required shapes for holding device 16 and handling device 10 are those shapes that enable semiconductor wafer 11, whether warped or unwarped, to be held in substantially planar form 15 during transferal of semiconductor wafer 11. For instance, handling device 10 can be Y-shaped or fork-shaped where the tines of the fork or the Y support semiconductor wafer 11 in substantially planar form 15.

Figure 3:
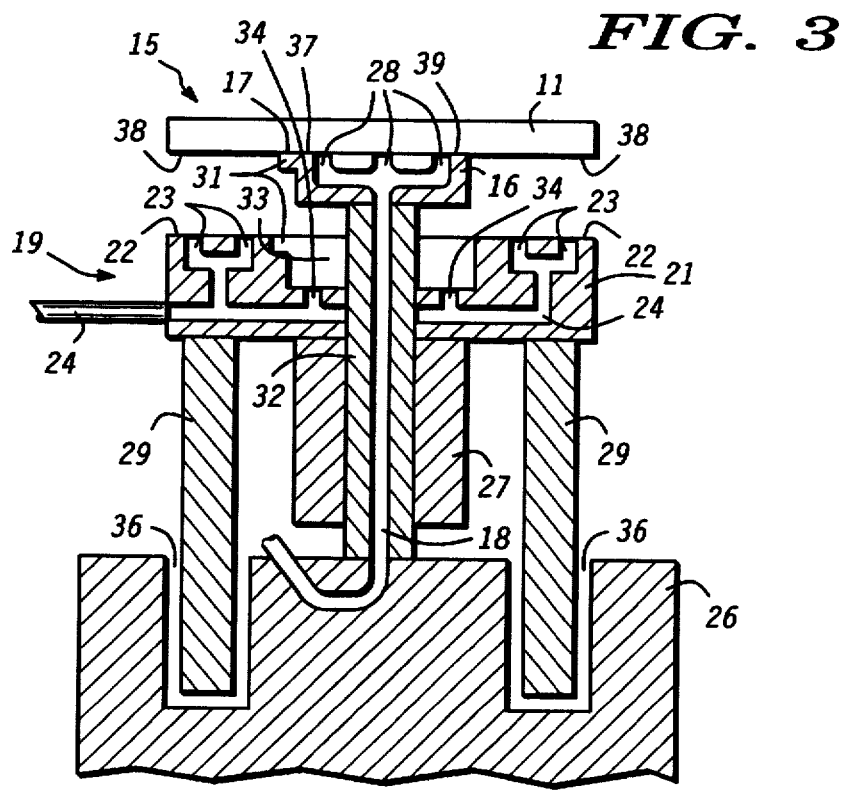
FIG. 3 is an embodiment of the present invention illustrating a side view of a two-platform wafer chuck.

In FIG. 3, holding device 16 supports semiconductor wafer 11 in substantially planar form 15. Holding device 16 is a wafer chuck or a wafer platform having substantially planar surface 17 with plurality of holes 28 in which attraction device 18 resides. Substantially planar surface 17 provides support for substantially planar form 15 of semiconductor wafer 11. Attraction device 18 uses a vacuum force to support semiconductor wafer 11 in substantially planar form 15 against substantially planar surface 17. Holding device 16 supports semiconductor wafer 11 during probing, chemical processing, flat alignment, and transferal of semiconductor wafer 11.

In the preferred embodiment, holding device or wafer platform 16 is part of two-platform wafer chuck 19 that also includes wafer platform 21. Similar to wafer platform 16, wafer platform 21 has substantially planar surface 22 with plurality of holes 23 in which attraction device 24 resides. Attraction device 24 maintains semiconductor wafer 11 in substantially planar form 15 against substantially planar surface 22.

Wafer platforms 16 and 21 are concentric plate-like objects with wafer platform 21 having a larger diameter than wafer platform 16. Diameter of wafer platform 21 is at least as large as the diameter of semiconductor wafer 11. Wafer platform 21 has recess 33 at its center to permit wafer platform 16 to fit in recess 33 of wafer platform 21. When wafer platform 16 is seated in recess 33, substantially planar surfaces 17 and 22 of concentric plate-like objects 16 and 21, respectively, combine to form a common substantially planar surface to support semiconductor wafer 11 in substantially planar form 15.

During auto-probing of devices on semiconductor wafer 11, probe contact pressure on semiconductor wafer 11 can fracture semiconductor wafer 11. Therefore, when all devices or circuits across semiconductor wafer 11 are probed, the entire surface of semiconductor wafer 11 is supported to prevent wafer breakage. In order to prevent semiconductor wafer 11 from fracturing during auto-probing, wafer platform 21 provides additional support for semiconductor wafer 11 in areas where wafer platform 16 does not provide support. Wafer platform 16 supports area 37 of semiconductor wafer 11, and when wafer platform 16 is seated in recess 33, wafer platform 21 supports area 38 of semiconductor wafer 11. Areas 37 and 38 are on side 39 of semiconductor wafer 11.

Plurality of holes 34 in recess 33 contains attraction device 24 for keeping wafer platforms 16 and 21 in a fixed position relative to each other when the common substantially planar surface is formed. Attraction device 24 uses a vacuum seal to fix the relative positions of wafer platforms 16 and 21. In this manner, vacuum device 24 simultaneously supports semiconductor wafer 11 in substantially planar form 15 and holds together wafer platforms 16 and 21. Alternatively, instead of attraction device 24, a separate attraction device can reside in holes 34 and be used to fix the relative positions of wafer platforms 16 and 21.

Similar to attraction device 13 of FIG. 2, attraction devices 18 and 24 of FIG. 3 can use a magnetic, pneumatic, mechanical, electrostatic, or vacuum force. Additionally, attraction devices 13, 18, and 24 can be a common attraction device using a similar force or can be different attraction devices using different or similar forces. It is to be understood that the embodiments of attraction device 18 and attraction device 24 may differ from the embodiments illustrated in FIG. 3. The desired force or forces used by attraction devices 18 and 24 determines the appropriate embodiments of attraction device 18 and 24, respectively. The purpose of attraction devices 18 and 24 is to force semiconductor wafer 11 down on substantially planar surfaces or flat surfaces 17 and 22, respectively, and to hold semiconductor wafer 11 in a flat or unwarped configuration.

Bottom end of rod 32 is connected to stage 26, and top end of rod 32 is connected to a central backside portion of wafer platform 16 to support wafer platform 16 above stage 26. Moving device 27 moves along rod 32 and is underneath wafer platform 21 for transporting wafer platform 21 up and down rod 32 and toward and away from semiconductor wafer 11 that is supported in substantially planar form 15 by wafer platform 16. Rod 32 fits through a hole in a central portion of wafer platform 21 such that wafer platforms 16 and 21 remain concentric while moving device 27 is in operation.

While moving device 27 can use a magnetic or a pneumatic means to move wafer platform 21, a mechanical means is used in FIG. 3. Moving device 27 uses a mechanical drive screw where a set of screw threads are on rod 32 and a complementary set of screw threads are on moving device 27. Moving device or mechanical drive screw 27 is underneath wafer platform 21 to push wafer platform 21 towards wafer platform 16. While being pushed towards wafer platform 16, wafer platform 21 does not rotate with mechanical drive screw 27.

Relative orientations of wafer platforms 16 and 21 are fixed with guide 31 that forces wafer platform 16 to fit in recess 33 in a predetermined manner when flat surfaces 17 and 22 combine to form the common substantially planar surface for supporting semiconductor wafer 11. Guide 31 includes a protrusion extending from wafer platform 16 and a notch cut out of wafer platform 21 at the periphery of recess 33. The protrusion and notch are complementarily shaped to ensure that wafer platform 16 and wafer platform 21 fit in a desired orientation when wafer platform 16 is seated in recess 33.

When wafer platform 16 is seated in recess 33 and flat surfaces 17 and 22 form the common flat surface to support semiconductor wafer 11, stage 26 can be rotated to adjust the flat orientation of semiconductor wafer 11. If wafer platforms 16 and 21 rotate in different direct directions or at different speeds while supporting semiconductor wafer 11 in substantially planar form 15, semiconductor wafer 11 can fracture due to the resulting stresses imposed upon it. Pins 29, guide 31, and the vacuum seal between wafer platforms 16 and 21 maintain a fixed orientation between wafer platform 16, wafer platform 21, and stage 26 during the rotation of semiconductor wafer 11. One end of pins 29 are attached to wafer platform 21. Distal end of pins 29 is inserted into slots 36 which are cut into stage 26. When moving device 27 transports wafer platform 21 up and down rod 32, pins 29 move up and down in slots 36 while maintaining the original orientation of wafer platform 21 relative to stage 26. Pins 29 do not slide out of slots 36 during transportation of wafer platform 21.

During processing of semiconductor wafer 11, two-platform wafer chuck 19 can move or remain stationary. For instance, during an auto-probe test, a probe card can be moved across semiconductor wafer 11 to probe individual devices or circuits on semiconductor wafer 11 while two-platform wafer chuck 19 remains stationary. However, for the preferred embodiment, two-platform wafer chuck 19 is mechanically moved during processing of semiconductor wafer 11 while the probe card remains stationary. The movement of two-platform wafer chuck 19 can also be accomplished by using a magnetic, pneumatic, or electrostatic device.

As described in FIG. 2 and FIG. 3, wafer platform 21 contacts semiconductor wafer 11 during processing of semiconductor wafer 11 but does not contact semiconductor wafer 11 during transferal of semiconductor wafer 11 onto or off of wafer platform 16. Non-contact of wafer platform 21 with semiconductor wafer 11 during semiconductor wafer 11 transferal permits wafer handling device 10 and wafer platform 16 to maintain substantially planar form 15 of semiconductor wafer 11 during the transferal process as described with reference to FIG. 2.

After the manufacturing process is complete and wafer platform 21 is no longer supporting semiconductor wafer 11, semiconductor wafer 11 is removed from holding device 16 while maintaining the substantially planar form 15 of semiconductor wafer 11. Removal can be accomplished with wafer handling device 10 of FIG. 2 or with a different wafer handling device.

A similar transferal process embodied in FIG. 2 can describe the transferal of semiconductor wafer 11 from holding device 16 to handling device 10. Initially, holding device 16 supports semiconductor wafer 11 in substantially planar form 15. Then wafer handling device 10 moves to contact and simultaneously hold semiconductor wafer 11 while maintaining substantially planar form 15 of semiconductor wafer 11. Finally, holding device 16 releases semiconductor wafer 11, and handling device 10 supports semiconductor wafer 11 in substantially planar form 15 and moves away from holding device 16.

The present invention is not limited to the preferred embodiments illustrated in FIG. 3. As an alternative, moving device 27 transports wafer platform 16 instead of wafer platform 21. Additionally, semiconductor wafer 11 can be transferred from handling device 10 to wafer platform 21 instead of wafer platform 16. Furthermore, it is to be understood that the shapes of wafer platform 16 and wafer platform 21 can vary from the preferred embodiments illustrated in FIG. 3. The required shapes of wafer platform 16 and wafer platform 21 are those shapes that enable semiconductor wafer 11, whether warped or unwarped, to be held in substantially planar form 15. For example, an alternative embodiment uses complementary semicircular shapes for wafer platform 16 and wafer platform 21.

Additionally, two-platform wafer chuck or apparatus 19 can be modified to have wafer platform 16 and not wafer platform 21. In this embodiment, wafer handling device 10 serves as a first wafer platform and holding device 16 serves as a second wafer platform. Wafer handling device 10 remains in contact with semiconductor wafer 11 during the entire automated handling process, including during the processing of semiconductor wafer 11 when both wafer handling device 10 and holding device 16 support semiconductor wafer 11.

Furthermore, some processing procedures such as an auto-probe test require an identical electrical potential between wafer platform 16 and wafer platform 21. One method to achieve a common electric potential between two objects is to connect the two objects with a conductor. For instance, wafer platform 16 can have conductive whisker-like brushes extending radially outward from wafer platform 16. In this manner, when wafer platform 21 contacts semiconductor wafer 11, wafer platform 21 also contacts the whisker-like brushes, and thus wafer platform 16 is kept at the same electric potential as wafer platform 21.

Therefore, in accordance with the present invention, it is apparent there has been provided an improved apparatus for and method of holding a piece of semiconductor that overcomes the disadvantages of the prior art. The present invention uses a two-platform wafer chuck to support warped wafers in a substantially planar form during critical semiconductor manufacturing process steps such as photolithography and auto-probe. The improved method and apparatus is compatible with wafer transferring and handling techniques which maintain wafer flatness, is compatible with holding warped and unwarped wafers, and is similar in size to conventional wafer holding devices in order to conserve cleanroom space for economic feasibility.

We claim:

1. An apparatus for holding a piece of semiconductor during a manufacturing process, the apparatus comprising:

a first wafer platform to support, in a substantially planar form, a first area on a side of the piece of semiconductor;

a stage coupled to the first wafer platform to support the first wafer platform;

a second wafer platform to substantially maintain the substantially planar form of the piece of semiconductor whereby the second wafer platform supports a second area on the side of the piece of semiconductor while the first wafer platform supports the first area of the piece of semiconductor, and whereby the first wafer platform and the second wafer platform support the piece of semiconductor during the manufacturing process; and a guide connected to the first and second wafer platforms wherein the guide maintains a fixed relative orientation between the first and second wafer platforms while the first and second wafer platforms both support the piece of semiconductor and wherein the guide does not maintain the fixed relative orientation between the first and second wafer platforms while only the first wafer platform or only the second wafer platform supports the piece of semiconductor.

2. The apparatus of claim 1, further comprising a moving device adjacent to the second wafer platform to transport the second wafer platform toward and away from the piece of semiconductor supported by the first wafer platform.

3. The apparatus of claim 1 wherein the first and second wafer platforms are concentric plate-like objects.

4. The apparatus of claim 3 wherein the second wafer platform is larger than the first wafer platform.

5. The apparatus of claim 1 further comprising a first vacuum device connected to the first wafer platform whereby the first vacuum device forces the piece of semiconductor in the substantially planar form against the first wafer platform.

6. The apparatus of claim 5 further comprising a second vacuum device connected to the second wafer platform whereby the second vacuum device forces the piece of semiconductor in the substantially planar form against the second wafer platform.

7. An apparatus for holding a piece of semiconductor, the apparatus comprising:

a first platform having a protrusion, the first platform supporting a portion of the piece of semiconductor; and a second platform having a surface to support a different portion of the piece of semiconductor wherein the surface has a recess and a notch, the recess shaped to contain the first platform, the notch shaped to contain the protrusion.

8. The apparatus according to claim 7, wherein the notch and the protrusion are complementarily shaped.

9. The apparatus according to claim 7, wherein the recess and the first platform are complementarily shaped.

10. The apparatus according to claim 7, further comprising:

a stage having a slot, the stage supporting the first platform; and a pin coupled to the second platform and partially located in the slot, wherein the pin and the slot maintain a first relative orientation between the second platform and the stage and wherein the notch and the protrusion maintain a relative orientation between the first and second platforms when the first platform is seated in the recess.

11. The apparatus according to claim 7 wherein the first and second platforms are concentric plate-like objects.

12. The apparatus according to claim 7, wherein the recess is connected to the notch.

13. The apparatus according to claim 7, further comprising a first attraction device, wherein the recess has a hole coupled to the first attraction device.

14. The apparatus according to claim 13, further comprising:

a second attraction device, wherein the first platform has a first surface to support the portion of the piece of semiconductor, the first surface having a hole coupled to the second attraction device; and wherein the surface of the second platform has a hole coupled to the first attraction device.

15. The apparatus according to claim 14, wherein the first surface and the surface of the second platform form a substantially planar surface when the first platform is seated in the recess of the second platform.

16. An apparatus for holding a piece of semiconductor, the apparatus comprising:

a first platform having a first surface, the first surface having a recess, the recess having a hole;

a second platform having a second surface, the second platform configured to fit in the recess; and an attraction device coupled to the hole.

17. The apparatus according to claim 16, wherein the first and second surfaces form a substantially planar surface when the second platform is in the recess.

18. The apparatus according to claim 16, further comprising:

a pin coupled to the first platform; and a stage supporting the second platform, the stage having a slot containing the pin.

19. The apparatus according to claim 16, further comprising a guide coupled to the first and second platforms to maintain a relative orientation between the first and second platforms.

20. The apparatus according to claim 19, wherein the first platform has a notch, wherein the second platform has a protrusion configured to fit in the notch, and wherein the notch and the protrusion form the guide.

* * * * *